United States Patent
Hauptmann et al.

(10) Patent No.: US 11,099,487 B2
(45) Date of Patent: Aug. 24, 2021

(54) METHOD AND APPARATUS FOR OPTIMIZATION OF LITHOGRAPHIC PROCESS

(71) Applicant: ASML NETHERLANDS B.V., Veldhoven (NL)

(72) Inventors: Marc Hauptmann, Turnhout (BE); Everhardus Cornelis Mos, Best (NL); Weitian Kou, Eindhoven (NL); Alexander Ypma, Veldhoven (NL); Michiel Kupers, Roermond (NL); Hyunwoo Yu, Hwaseong-si (KR); Min-Sub Han, Yongin-Si (KR)

(73) Assignee: ASML Netherlands BV, Veldhoven (NL)

( * ) Notice: Subject to any disclaimer, the term of this patent is extended or adjusted under 35 U.S.C. 154(b) by 0 days.

(21) Appl. No.: 16/495,416

(22) PCT Filed: Mar. 28, 2018

(86) PCT No.: PCT/EP2018/057926
§ 371 (c)(1),
(2) Date: Sep. 19, 2019

(87) PCT Pub. No.: WO2018/197143
PCT Pub. Date: Nov. 1, 2018

(65) Prior Publication Data
US 2020/0026201 A1    Jan. 23, 2020

(30) Foreign Application Priority Data

Apr. 28, 2017  (EP) .................................... 17168801

(51) Int. Cl.
*G03F 7/20* (2006.01)
*G03F 9/00* (2006.01)

(52) U.S. Cl.
CPC ........ *G03F 7/70633* (2013.01); *G03F 7/7085* (2013.01); *G03F 7/70525* (2013.01); *G03F 9/7003* (2013.01)

(58) Field of Classification Search
CPC .. G03F 7/705; G03F 7/70641; G03F 7/70258; G03F 7/70525; G03F 7/70633;
(Continued)

(56) References Cited

U.S. PATENT DOCUMENTS 5,912,983 A    6/1999  Hiratsuka
6,650,955 B1 *  11/2003  Sonderman ...... G05B 19/41865
                                              700/108

(Continued)

FOREIGN PATENT DOCUMENTS

JP    2002064046    2/2002
KR    20090095510   9/2009
(Continued)

OTHER PUBLICATIONS

Pellegrini et al.; "Exposure field matching of multiple step-and-scan systems to multiple step-and-repeat systems"; IEEE/SEMI 6 Advanced Semiconductor Manufacturing Conference and Workshop. Conference Paper; Publisher: IEEE (Year: 1996).*

(Continued)

*Primary Examiner* — Helen Rossoshek
(74) *Attorney, Agent, or Firm* — Pillsbury Winthrop Shaw Pittman LLP

(57) ABSTRACT

A lithographic process is performed on a set of semiconductor substrates consisting of a plurality of substrates. As part of the process, the set of substrates is partitioned into a number of subsets. The partitioning may be based on a set of characteristics associated with a first layer on the substrates. A fingerprint of a performance parameter is then determined for at least one substrate of the set of substrates.

(Continued)

Under some circumstances, the fingerprint is determined for one substrate of each subset of substrates. The fingerprint is associated with at least the first layer. A correction for the performance parameter associated with an application of a subsequent layer is then derived, the derivation being based on the determined fingerprint and the partitioning of the set of substrates.

21 Claims, 7 Drawing Sheets

(58) Field of Classification Search
 CPC ............ G03F 7/70616; G03F 7/70625; G03F 9/7046; G03F 7/7085; G03F 9/7003; Y02P 90/02; H01L 21/027; H01L 21/67276
 See application file for complete search history.

(56) References Cited

U.S. PATENT DOCUMENTS

| | | | | |
|---|---|---|---|---|
| 7,062,411 | B2* | 6/2006 | Hopkins | C23C 16/52 324/512 |
| 7,084,952 | B2* | 8/2006 | Jeunink | G03F 7/70258 355/30 |
| 7,333,173 | B2* | 2/2008 | Chiang | G03F 7/70633 355/53 |
| 7,443,486 | B2* | 10/2008 | Van Ingen Schenau | G03F 7/70625 355/69 |
| 7,468,795 | B2* | 12/2008 | Simons | G03F 7/70516 356/401 |
| 7,808,613 | B2* | 10/2010 | Lof | G03F 7/70541 355/53 |
| 8,294,907 | B2* | 10/2012 | Cramer | G01N 21/47 356/625 |
| 8,594,827 | B2* | 11/2013 | Kiermasz | H01L 22/12 700/121 |
| 8,717,536 | B2* | 5/2014 | Menchtchikov | G03F 7/70616 355/53 |
| 8,796,684 | B2* | 8/2014 | Schoumans | G03F 7/70608 257/48 |
| 8,908,148 | B2* | 12/2014 | Geraets | G01N 21/956 355/55 |
| 8,947,643 | B2* | 2/2015 | Padiy | G03F 7/70616 355/77 |
| 9,070,622 | B2* | 6/2015 | Ke | G03F 7/70633 |
| 9,625,831 | B1* | 4/2017 | Segawa | G03F 9/7003 |
| 9,879,988 | B2* | 1/2018 | Liu | G03F 7/70633 |
| 9,946,165 | B2* | 4/2018 | Ypma | G03F 7/70641 |
| 9,971,478 | B2* | 5/2018 | Mos | G03F 7/70616 |
| 10,474,045 | B2* | 11/2019 | Bijnen | G03F 9/7092 |
| 10,520,829 | B2* | 12/2019 | Wang | G03F 1/36 |
| 10,571,806 | B2* | 2/2020 | Tel | G03F 7/70633 |
| 10,571,812 | B2* | 2/2020 | Li | G03F 7/70641 |
| 10,578,980 | B2* | 3/2020 | Huijgen | G03F 7/705 |
| 10,613,445 | B2* | 4/2020 | Hauptmann | G03F 7/70508 |
| 10,642,161 | B1* | 5/2020 | Corliss | G03F 7/70358 |
| 10,649,342 | B2* | 5/2020 | Van Der Logt | G03F 7/70525 |
| 10,712,672 | B2* | 7/2020 | Jochemsen | G03F 7/70633 |
| 2004/0018305 | A1* | 1/2004 | Pagano | H01L 21/67236 427/255.7 |
| 2005/0018163 | A1 | 1/2005 | Jeunink et al. | |
| 2008/0030701 | A1 | 2/2008 | Lof | |
| 2009/0225292 | A1* | 9/2009 | Shiroiwa | G03F 7/7085 355/53 |
| 2012/0274916 | A1 | 11/2012 | Shiroiwa et al. | |
| 2013/0230797 | A1* | 9/2013 | Van Der Sanden | G03F 9/7088 430/30 |
| 2015/0079700 | A1* | 3/2015 | Ke | G03F 7/70525 438/5 |
| 2017/0363969 | A1* | 12/2017 | Hauptmann | G01N 21/9501 |
| 2018/0046737 | A1* | 2/2018 | Willems | G03F 7/70633 |
| 2018/0067900 | A1* | 3/2018 | Mos | G03F 7/70633 |
| 2018/0307135 | A1* | 10/2018 | Ten Berge | G03F 7/70633 |
| 2018/0314168 | A1* | 11/2018 | Van Haren | G03F 7/705 |
| 2019/0033727 | A1* | 1/2019 | Noot | G03F 7/70633 |
| 2019/0049859 | A1* | 2/2019 | Tsiatmas | G03F 7/70616 |
| 2019/0064680 | A1* | 2/2019 | Schmitt-Weaver | G03F 7/70633 |
| 2019/0086810 | A1* | 3/2019 | Tel | G03F 7/70625 |
| 2019/0163075 | A1* | 5/2019 | Theeuwes | G03F 7/70508 |
| 2019/0235391 | A1* | 8/2019 | Bijnen | G03F 7/705 |
| 2019/0310553 | A1* | 10/2019 | Jochemsen | G03F 7/705 |
| 2019/0317412 | A1* | 10/2019 | Mos | G03F 7/70616 |
| 2019/0361358 | A1* | 11/2019 | Tel | G03F 7/705 |
| 2019/0384164 | A1* | 12/2019 | Van Kessel | G03F 1/62 |
| 2020/0019069 | A1* | 1/2020 | Hasan | G03F 7/70775 |
| 2020/0103761 | A1* | 4/2020 | Ypma | G03F 7/70658 |
| 2020/0124968 | A1* | 4/2020 | Tel | G03F 7/70633 |
| 2020/0150547 | A1* | 5/2020 | Huijgen | G01N 21/956 |
| 2020/0233310 | A1* | 7/2020 | Van Der Logt | G03F 7/70641 |
| 2020/0233315 | A1* | 7/2020 | Nije | G03F 7/70491 |
| 2020/0249576 | A1* | 8/2020 | Warnaar | G03F 7/70633 |
| 2020/0356881 | A1* | 11/2020 | Bastani | G03F 7/70508 |

FOREIGN PATENT DOCUMENTS

| | | |
|---|---|---|
| WO | 2018072962 | 4/2018 |
| WO | 2018072980 | 4/2018 |

OTHER PUBLICATIONS

International Search Report and Written Opinion issued in corresponding PCT Patent Application No. PCT/EP2018/057926, dated May 18, 2018.

Lee, Hong-Goo, et al.: "Reduction of in-lot overlay variation with integrated metrology, and a holistic control strategy", Proc. of SPIE, vol. 9635, Oct. 23, 2015.

Lee, Honggoo, et al.: "Experimental verification of on-product overlay improvement by intra-lot overlay control using metrology based grouping", Proc. of SPIE, vol. 10147, Mar. 17, 2017.

Chinese Office Action issued in corresponding Chinese Patent Application No. 20188027615, dated Mar. 3, 2021.

Korean Office Action issued in corresponding Korean Patent Application No. 10-2019-7032661, dated Jan. 8, 2021.

* cited by examiner

METHOD AND APPARATUS FOR OPTIMIZATION OF LITHOGRAPHIC PROCESS

CROSS-REFERENCE TO RELATED APPLICATIONS

This application is the U.S. national phase entry of PCT Patent Application No. PCT/EP2018/057926, filed on Mar. 28, 2018, which claims the benefit of priority of European patent no. 17168801.3, which was filed on Apr. 28, 2017 and which is incorporated herein in its entirety by reference.

FIELD

The present invention relates to methods for controlling a lithographic process carried out by a lithographic apparatus, and in particular to methods for optimizing a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers, each having a particular pattern and material composition, are applied to define functional devices and interconnections of the finished product.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Measurements are performed to correct for a plurality of error effects or mechanisms. As measurement processes improve, one error mechanism that is becoming increasingly important are so-called wafer-to-wafer variations. Known methods are typically used on a per-batch or per-lot basis in order to reduce the impact of the measurement process on production throughput. Accordingly, any variations that occur between individual substrates are not, and cannot be, taken into account. This reduces the accuracy of the lithographic process, which may negatively impact the quality of the produced substrates.

Further, as pattern geometries become increasingly complex, the known methods may under certain circumstances result in corrections that reduce the functionality of patterned devices, or even render them entirely unfunctional.

SUMMARY

According to a first aspect of the invention, there is provided a method for optimizing a lithographic process, the method comprising:

partitioning a set of substrates associated with at least a first layer into a plurality of subsets of substrates;

determining a fingerprint of a performance parameter associated with the at least first layer for at least one substrate of the set of substrates; and deriving a correction for the performance parameter associated with an application of a subsequent layer to the set of substrates based on the determined fingerprint and the partitioning of the set of substrates.

According to a second aspect of the invention, there is provided a method for optimizing a lithographic process, wherein the step of determining comprises:

determining a first fingerprint of a performance parameter associated with a second layer and an $n^{th}$ layer of the substrate, wherein the $n^{th}$ layer is provided prior to the second layer and the second layer is provided prior to the first layer; and determining a second fingerprint of a performance parameter associated with the first layer and the second layer based on the fingerprint of the performance parameter associated with the second layer and the $n^{th}$ layer and at least a further set of characteristics.

According to a third aspect of the invention, there is provided a control system for controlling a lithographic process, the control system comprising:

an arrangement for performing the partitioning step of a set of substrates into a plurality of subsets of substrates as set out above;

an arrangement for carrying out a determining step of a fingerprint of a performance parameter as set out above; and an arrangement for carrying out a deriving step of a correction for the performance parameter as set out above.

According to a fourth aspect of the invention, there is provided a control system for controlling a lithographic process, the control system comprising:

an arrangement for performing a determining step of a first fingerprint of a performance parameter as set out above; and an arrangement for performing a determining step of a second fingerprint of a performance parameter as set out above.

According to a fifth aspect of the invention, there is provided a lithographic apparatus comprising:

an illumination optical system arranged to illuminate a pattern, and a projection optical system arranged to project an image of the pattern onto a substrate; and a control system as set out above.

According to a sixth aspect of the invention, there is provided an inspection apparatus comprising a control system as set out above.

According to a seventh aspect of the invention, there is provided a lithographic system comprising a lithographic apparatus as set out above or an inspection apparatus as set out above.

According to an eighth aspect of the invention, there is provided a computer program product containing one or more sequences of machine-readable instructions for implementing a method as set out above.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
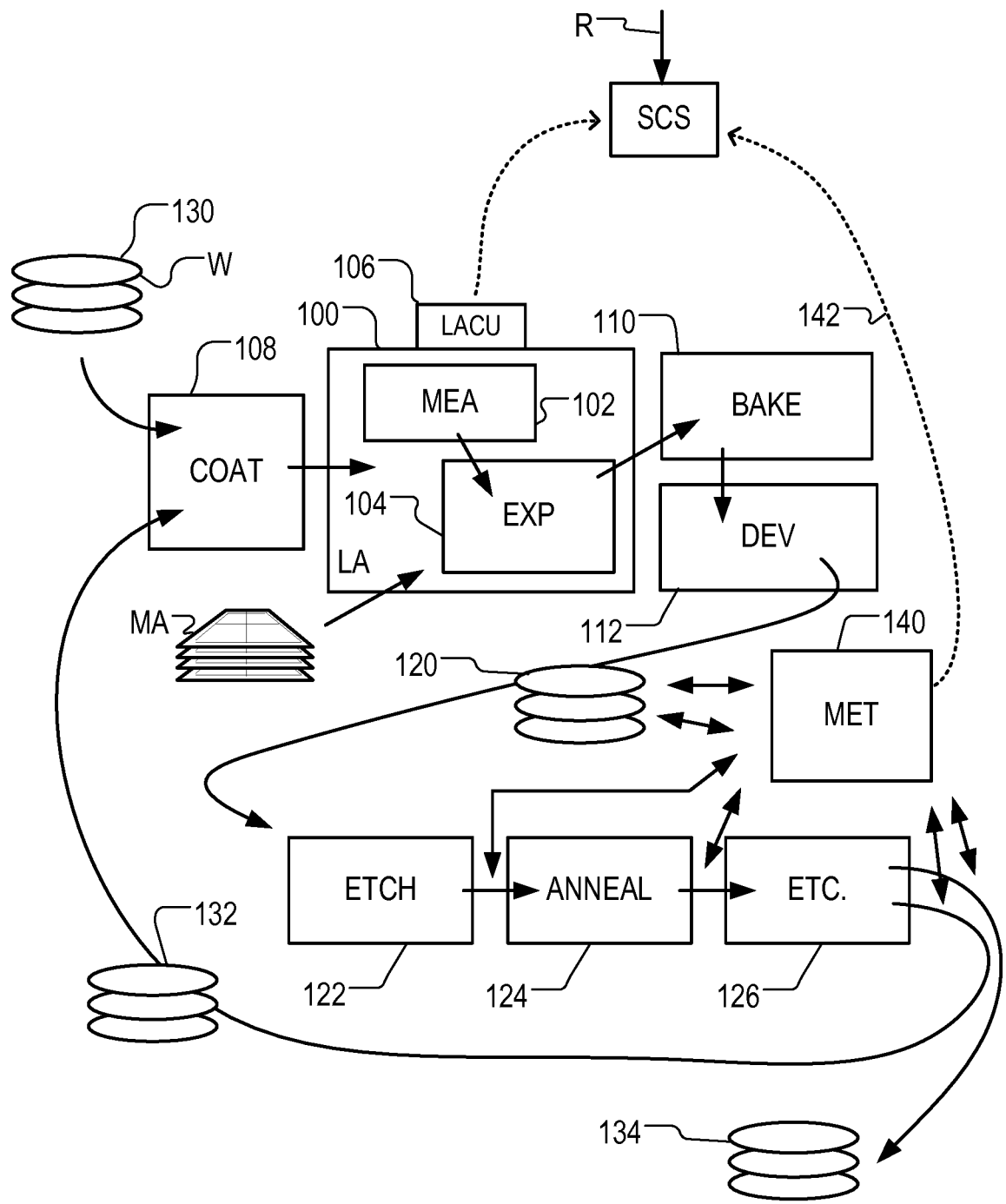
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Figure 2:
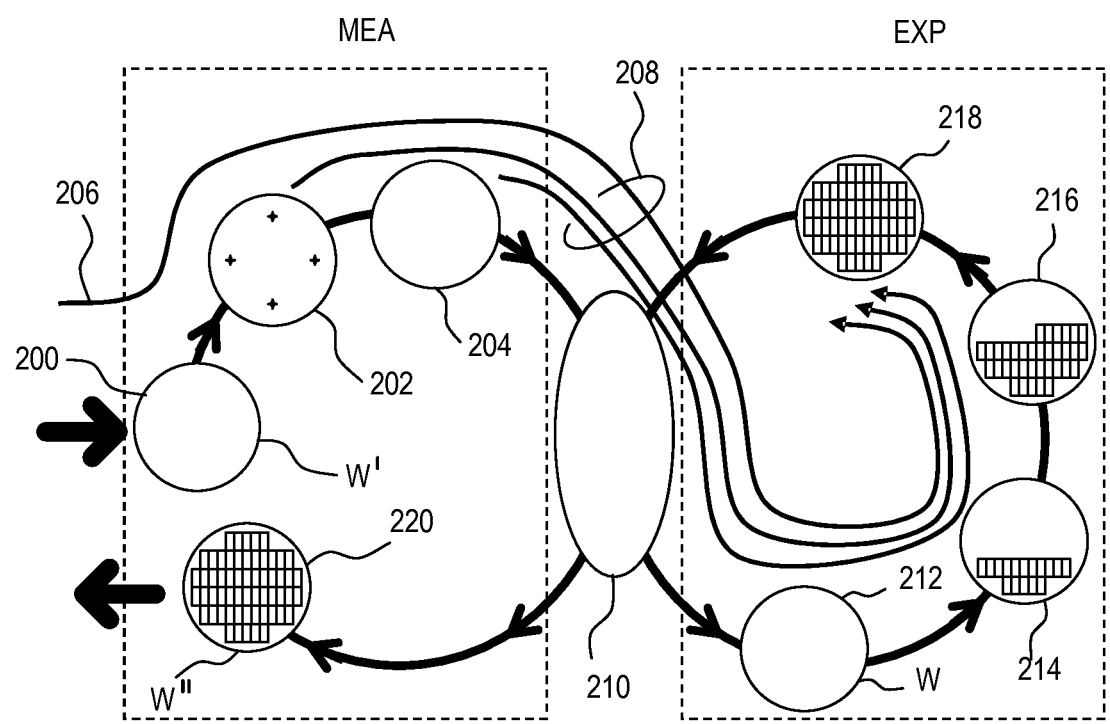
FIG. 2 illustrates steps to expose target portions on a substrate.

FIG. 2 illustrates the steps to expose target portions (e.g. dies) on a substrate W in the dual stage apparatus of FIG. 1. The process according to conventional practice will be described first.

On the left hand side within a dotted box are steps performed at a measurement station MEA, while the right hand side shows steps performed at the exposure station EXP. For the purposes of this description, it is assumed that a substrate W has already been loaded into the exposure station on a substrate table. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using substrate marks and image sensors (not shown) are used to measure and record alignment of the substrate relative to the substrate table on which the substrate is placed. In addition, several alignment marks across the substrate W' will be measured using an alignment sensor. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using a level sensor. Conventionally, the height map is used only to achieve accurate focusing of the exposed pattern. As will be explained further below, the present apparatus uses height map data also to supplement the alignment measurements.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the substrate tabless within the apparatus, so that the substrates W, W' remain accurately clamped and positioned on their respective substrate tables to preserve relative alignment between the substrate tables and substrates themselves. Accordingly, once the substrate tables have been swapped, determining the relative position between the projection system and a substrate table is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Subsequently, the substrate may be transferred to a metrology apparatus, wherein further measurements may be performed as described above. The metrology results may be used in conjunction with the alignment data and height map obtained at the measuring station to improve the performance of the lithographic apparatus.

One problem with known lithographic apparatuses and methods is that it is generally only possible to perform metrology on a small proportion of production substrates. This is because of the need to maximize production throughput. In other terms, while it is, in theory, possible to perform metrology on a significant proportion of substrates, this would lead to a lowering of throughput, thereby driving the cost for individual substrates up. In known apparatuses, substrate variations are typically measured one a lot-to-lot basis or chuck-to-chuck basis. This means that, corrections for a given lot or chuck of substrates is typically based on data obtained from previous lots or chucks.

However, "wafer to wafer" (W2W) variations contribute significantly to overlay error. Accordingly, in order to reduce overall overlay error, it is desirable to reduce these contributions. However, using known methods, reducing W2W variations renders high volume production impractical due to the time and complexity of the required methods and calculations.

Figure 3:
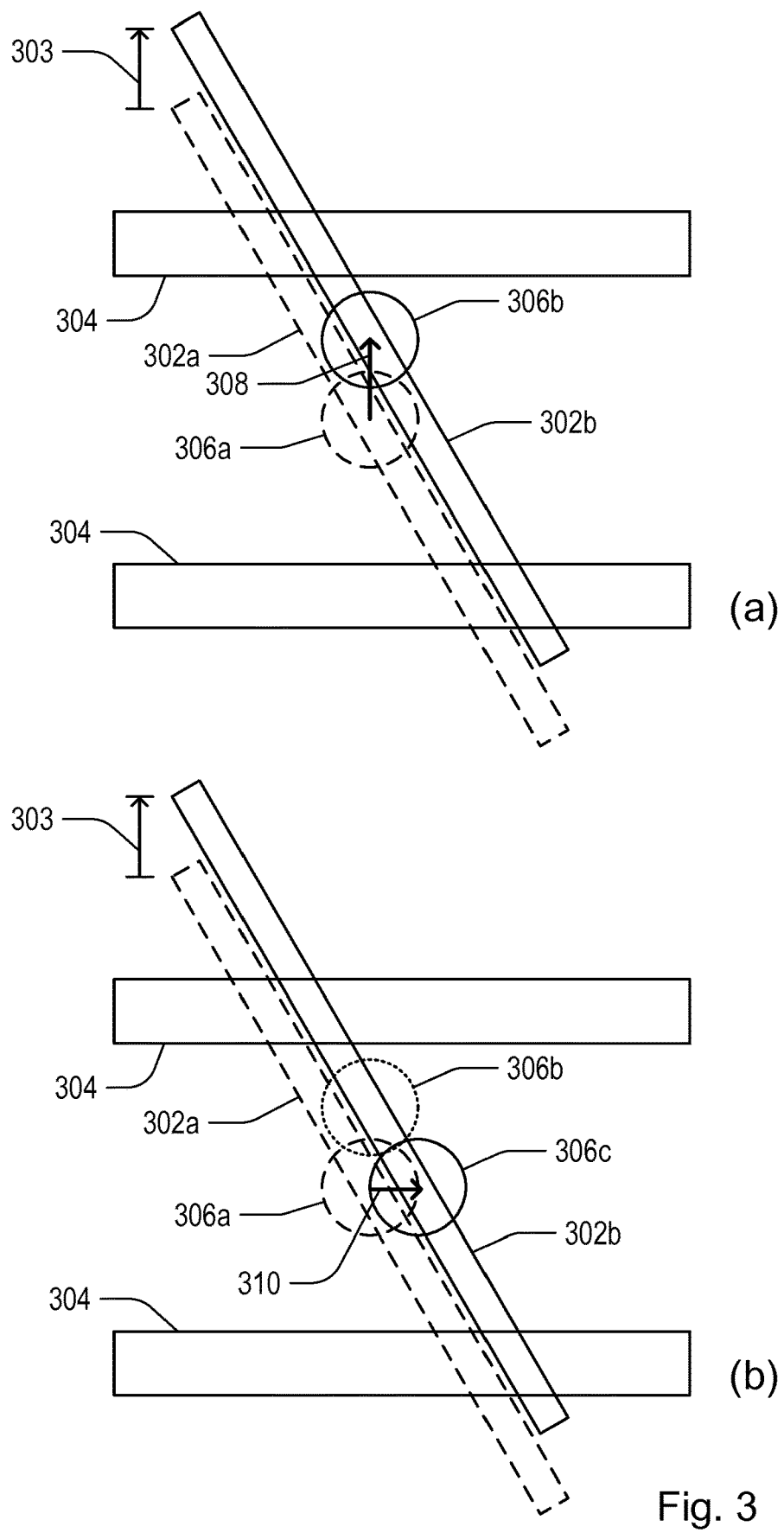
FIG. 3 shows an example of correcting for offsets between patterned layers on a substrate.

It has been realized that it is possible to mitigate the effect of W2W variations by feeding forward metrology information from preceding layers and utilizing it to control a current layer to be patterned. An example of an effect that can be mitigated by way of this principle will now be discussed with reference to FIGS. 3(a) and 3(b).

FIG. 3(a) shows schematically an exemplary cell geometry of an integrated circuit element 300 (e.g. a memory cell). In the present example, the integrated circuit element comprises a first component 302a, 302b (e.g. the active portion of the circuit), a second component 304 (e.g. a wordline structure) and a third component 306a, 306b (e.g. a bitline contact). Current generations of memory cells (as well as other types of devices) increasingly comprise complex layouts that are non-perpendicular (i.e. wherein one or more components are positioned at obtuse or acute angles with respect to one or more of the other components). In the present example, the first component is oriented at a non-perpendicular angle relative to the second and third components.

During processing, the integrated circuit element is manufactured by sequentially patterning and exposing each of the components in a well-known fashion (such as described with reference to FIG. 2 above). In the present example, the second component 304 is processed subsequently to the first component 302a, 302b, and the third component 306a, 306b is processed subsequently to the second component.

Lithographic processing typically introduces one or more offsets or deviations (e.g. overlay error) from the idealized geometry. In the present example, the first component 302a and third component 306a are intended to be provided so as to substantially position the third component equidistant from two neighboring second components. However, in the present example an offset (e.g. overlay error) 303 is introduced during processing between the first component 302b and the second component 304. The offset may be monitored and measured, so as to enable the third component to be positioned correctly taking into account the introduced offset. Using existing methods, a correction 308 is applied to the position of the third component. Under normal circumstances, this will ensure that, despite the offset, the integrated circuit element remains fully functional.

However, under certain circumstances, such offset corrections may have a negative effect on the patterned device. For example, in the case of a memory cell with a non-perpendicular geometry, if the third component 306b is positioned too close to the second component 304 (or substantially on top thereof), the cell may malfunction or suffer from reduced functionality. By using existing mechanisms, this cannot easily be avoided or compensated for.

FIG. 3(b) illustrates the same situation as the one shown in FIG. 3(a), but with the addition of a 'feed forward' mechanism that enables preceding layers to be taken into account when patterning a present layer. In the present example, in order to correct for the offset described above and to avoid any potential reduction in functionality or malfunction of the integrated circuit element, a geometric correction 310 is introduced. In effect, the correction for the offset described with respect to FIG. 3(a) is replaced with the geometric correction. Whereas the correction described above displaces the third component along the same axis as the offset (i.e. in the Y-direction in the present example), the geometric correction displaces the third component in the X-direction. In this fashion, the offset may be corrected for, but without potentially resulting in a non-functional integrated circuit element.

Figure 4:
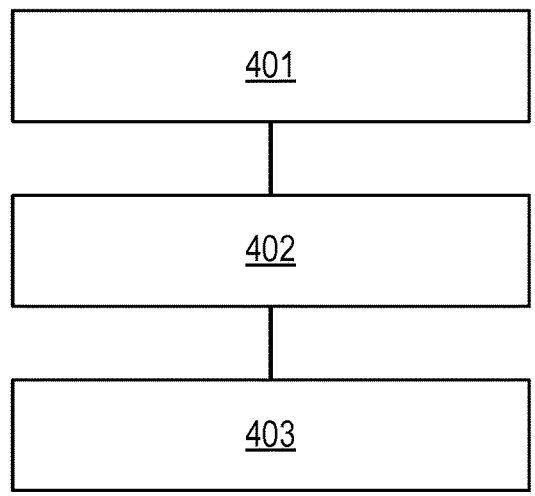
FIGS. 4 and 5 show different examples of clustering of object data to illustrate selection of representative wafers in principle.
Figure 5:
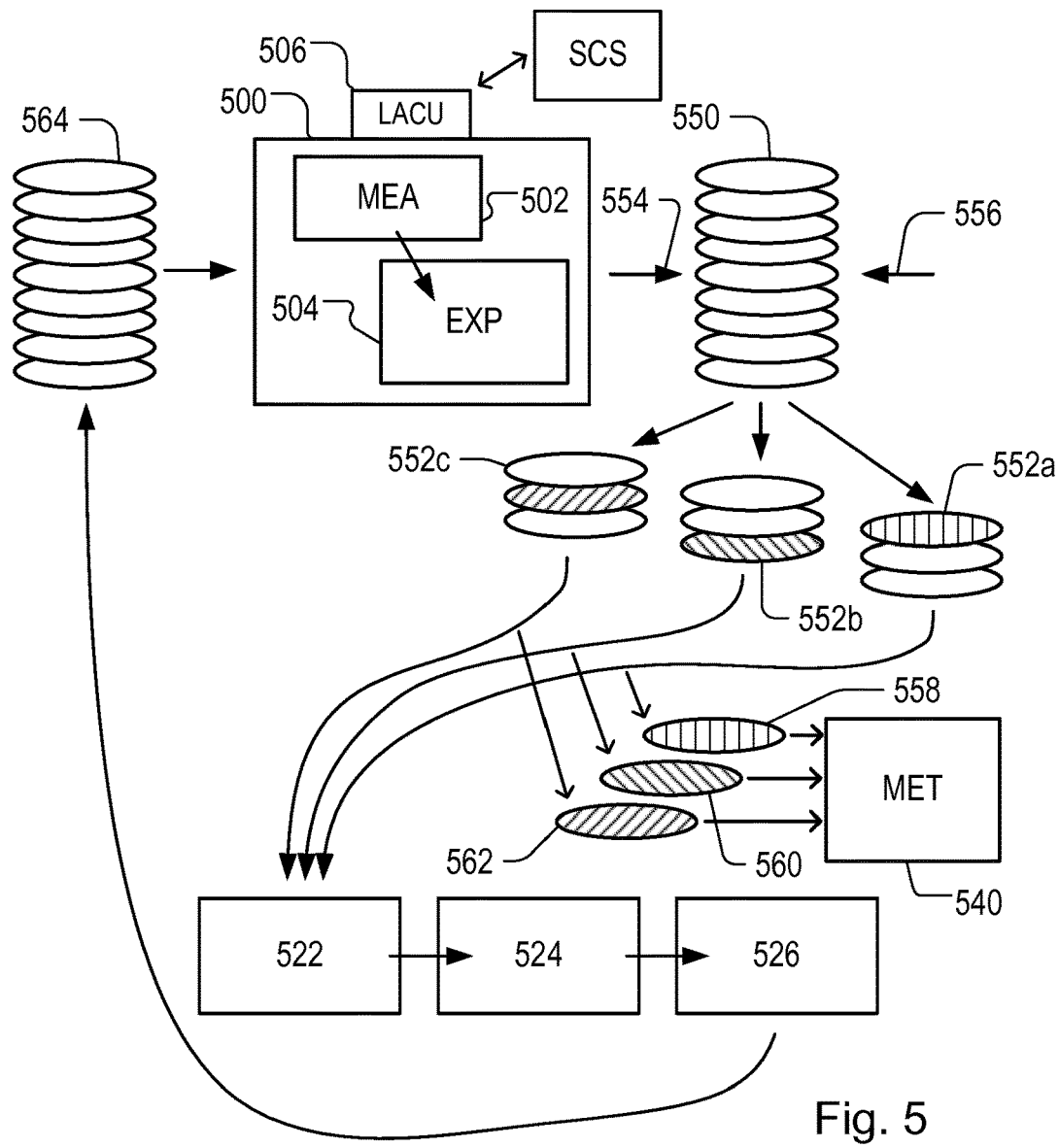

An exemplary method according to an embodiment of the present invention will now be described with reference to FIG. 4 and FIG. 5. Features of FIG. 5 that are similar to those of FIG. 1 are, for purposes of clarity, labelled with reference numerals similar to those of Figure, but with prefix "5" instead of "1". For purposes of conciseness, only elements that differ substantially from those of FIG. 1 will be described in detail below.

In a first step 401, a set of substrates 550 associated with at least a first layer is partitioned into a plurality of subsets 552a, 552b, 552c of substrates. The set of substrates may be a set of substrates that have had one or more patterned layers applied already as part of a lithographic process (as indicated by arrow 554). In other examples, the set of substrates may be a set of substrates that may be introduced into the lithographic process (as indicated by arrow 556), e.g. after having being processed at a remote location. The partitioning step may in some examples comprise one or more partitioning sub-steps.

It will be appreciated that, while reference is made to a first layer in the present example, it is, in principle, possible to perform the method steps for a plurality of preceding layers. This enables the use of additional data, from which process-related substrate variations may be determined with greater precision. For example, measurement data from all preceding patterned layers of a given set of substrates may be use to perform the method. Examples in which a plurality of preceding layers are employed will be discussed in further detail below.

The partitioning step may be performed in any suitable fashion and may use any suitable partitioning criteria. In some examples, the partitioning criteria used during the partitioning step are based on at least one set of characteristics associated with at least the first layer. Any suitable characteristics associated with the first layer may be used. In an example, the set of characteristics comprises at least one performance parameter associated with the at least first layer, including (but not limited to): overlay error; substrate warping or alignment error. In an example, a plurality of sets of characteristics associated with the first layer are used. In a specific example, two sets of characteristics are used during the partitioning step. The one or more characteristics may be measured as part of the lithographic process, or may be measured separately (e.g. as part of a periodic quality check).

In some examples, each of the plurality of subsets is associated with at least one value of at least one of the set of characteristics associated with the at least first layer. In an example, a first subset is associated with a first range of values for the at least one of the set of characteristics, a second subset is associated with a second range of values for the at least one of the set of characteristics, and a third subset is associated with a third range of values for the at least one of the set of characteristics. In other examples, each of the plurality of subsets is associated with a plurality of non-consecutive values. In some examples, each of the plurality of subsets may be associated with values of a plurality of characteristics associated with the at least first layer.

In general, each substrate of the set of substrates is sorted into a particular subset dependent on the value of the at least one characteristic during the partitioning step. This allows the set of substrates to be partitioned based on one or more characteristics of the substrates. This is to ensure that individual substrates are grouped with other substrates that may exhibit similar properties. As is known, process-induced variations depend on a number of factors, the effect of which may vary from substrate to substrate. In other terms, process-induced variations on a particular substrate may not be identical to the process-induced variations for another substrate immediately preceding the substrate or for a substrate subsequent to the substrate.

In a second step 402, a fingerprint of a performance parameter associated with the at least first layer for at least one substrate 558, 560, 562 of each set of substrates is determined. The determination may be carried out in any suitable fashion. In some examples, the determination is performed by an inspection apparatus 540.

In some examples, the fingerprint of the performance parameter is determined for at least one substrate for each of the plurality of subsets of substrates. It will be appreciated that this is merely exemplary, and that any suitable or advantageous number of substrates may be selected from each of the plurality of subsets. It is desirable to minimize the number of selected substrates, so as to reduce the impact of the method on the lithographic process. However, in certain situations, it may be advantageous or necessary to select a plurality of substrates for each of the plurality of subsets of substrates. For example, it may be determined that selecting two substrates, rather than one, from each subset increases the accuracy of the measurements.

In other examples, different numbers of substrates may be selected for each of the plurality of subsets of substrates. In an example, one substrate may be selected from a first subset, two substrates may be selected from a second subset, and three substrates may be selected from a third subset.

Any suitable performance parameter may be used. In some examples, performance parameters include, but are not limited to: overlay error; alignment; critical dimension; or focus error.

The fingerprint may be determined in any suitable fashion, which, in some examples, may be dependent on the relevant performance parameter. An exemplary determination method will be described in more detail in the following, although it will generally be appreciated that several specific implementations of the determination step may be envisaged. The determination may be performed by a suitable processing unit (e.g the LACU unit or SCS unit shown in FIG. 1).

In a third step 403, a correction for the performance parameter associated with an application of a second layer to the set of substrates based on the determined fingerprint and the partitioning of the set of substrates is derived. The derivation may be performed in any suitable fashion and by any suitable element. In some examples, the derivation is performed by the same processing unit that performs the second step.

Subsequently, the substrates may be processed as substantially described above with reference to FIG. 1, i.e. further processing steps 522, 524, 526 may be performed, on the substrates. After the further processing steps are completed, the substrates 564 may be returned to the lithographic apparatus 500 for further processing (such as the patterning of additional layers).

It will be realized that a plurality of specific implementations of the above-described method may be envisaged. The specific implementation is dependent on a variety of specific factors, e.g. the properties and characteristics of the particular lithographic system or apparatuses, the properties and characteristics of substrates used in the system, and/or additional external factors.

In multi-layer structures, as described above, it may be necessary to control process parameters (e.g. overlay error) for a particular processing layer with respect to a plurality of preceding layers. If such parameters are not adequately controlled, the result may be that the components either do not work or malfunction.

For example, in a multi-layer structure, each layer may have been patterned using different semiconductor materials, patterning device and/or patterning parameters. Accordingly, the overlay error for each layer may vary from layer to layer. It should be noted that, while overlay error is used as an example of a performance parameter, it is exemplary only. The following is, in principle, equally applicable to other performance parameters, such as (but not limited to) alignment, critical dimension or focus error.

Figure 6:
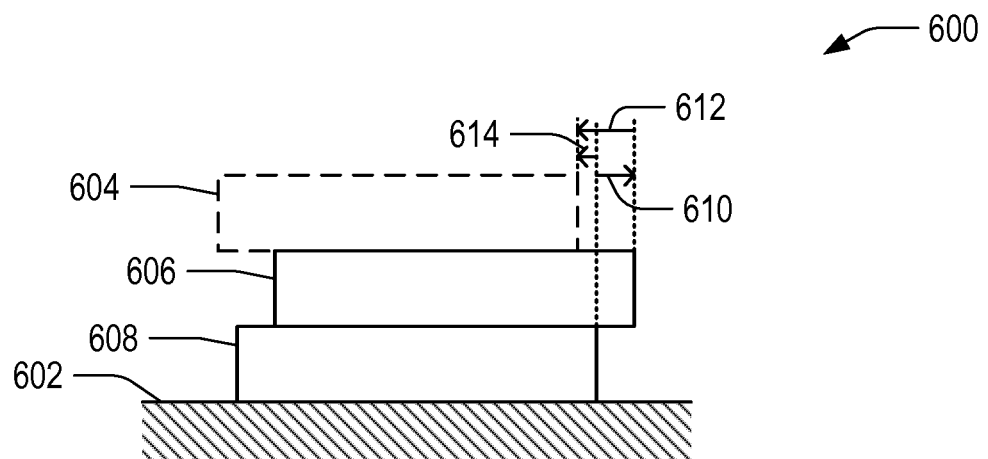
FIG. 6 illustrates offsets between patterned layers on a substrate.

An exemplary structure with a plurality of layers is shown in FIG. 6. The structure 600 comprises a first layer 604 to be provided, a second layer 606 and an $n^{th}$ layer 608 provided on a substrate 602. In the present example, the structure is comprised of three layers for exemplary and conciseness purposes only. It will be appreciated that n may be any suitable number, i.e. that any suitable number of layers may be used. While only a single $n^{th}$ layer is illustrated in FIG. 6, it will be appreciated that implementations of the structure described in the following, but comprising a plurality of $n^{th}$ layers, may be easily envisaged. The second and $n^{th}$ layers have been provided prior to the first layer. The second layer 606 has an overlay error 610 relative to the $n^{th}$ layer 608. During provision of the first layer, the overlay error 612 of the first layer relative to the second layer will differ from the overlay error 614 of the first layer relative to the $n^{th}$ layer. It will be appreciated that it is not possible to perfectly align the first layer with both of the second layer and $n^{th}$ layer. If the first layer is in alignment with the second layer, the first layer is misaligned with the $n^{th}$ layer. Similarly, if the first layer is in alignment with the $n^{th}$ layer, it is misaligned with the second layer. The misalignment may cause the patterned device produced by the lithographic process to have a reduced quality and/or functionality. In some instances, it may lead to malfunction or failure of the device.

To ensure quality and functionality of devices produced by the lithographic process, it is necessary to control overlay error with respect to a plurality of previously patterned layers rather than only a single underlying layer. For example, as described above, it may be necessary to control overlay error of a first layer with respect to the second layer as well as the $n^{th}$ layer. In order to do this, however, it is typically necessary to perform additional measurements. Such additional measurements are disadvantageous however, since the time required for them to be performed reduces production throughput.

Accordingly, it would be desirable to reduce the need for additional measurements to be performed. One known solution is to estimate the overlay error by utilizing a decomposition rule. In the following example, the structure described with reference is assumed to be comprised of three layers for exemplary purposes only. Accordingly, the $n^{th}$ layer will for conciseness and clarity purposes in the following example be referred to as a third layer. It should be noted, however, that, as described above, a structure may comprise any suitable number of layers, each of which may be taken into account in suitable decomposition rules. An exemplary decomposition rule for determining overlay error between a first layer and a second layer in a structure such as the one illustrated in FIG. 6 may be formulated as follows:

$$OV_{L1\text{-}L2} = OV_{L1\text{-}L3} OV_{L2\text{-}L3}$$

In this equation, $OV_{L1\text{-}L2}$ denotes the overlay error 612 between the first layer 604 and the second layer 606, $OV_{L1\text{-}L3}$ denotes the overlay error 614 between the first layer and the third layer 608, and $OV_{L2\text{-}L3}$ denotes overlay error 610 between the second layer and the third layer.

The overlay error between the first layer and the second layer may be determined based on either or both of estimated overlay errors or measured overlay errors. In an example, both of the overlay errors 610, 614 are estimated overlay errors. In other examples, the overlay error between the first layer and the second layer is determined based on previously measured overlay errors.

By estimating the overlay error between the first layer and the second layer, it becomes possible to reduce the amount of metrology required. Furthermore, by estimating the overlay error between the first layer and the second layer, the quality of the patterned device may be improved, since the overlay error for a particular layer can be corrected for during patterning of said layer. Accordingly, by using an estimated overlay error value, the quality of the patterned devices is improved and the production throughput is additionally increased.

However, due to differences between processing methodologies between individual layers, characteristics of the inspection apparatus, and/or characteristics of the lithographic apparatus used for processing, there may be a systematic difference between the estimated overlay error and a corresponding measured overlay error. In order to successfully use estimated overlay error values, it is therefore necessary to correctly calculate and compensate for this difference.

Figure 7:
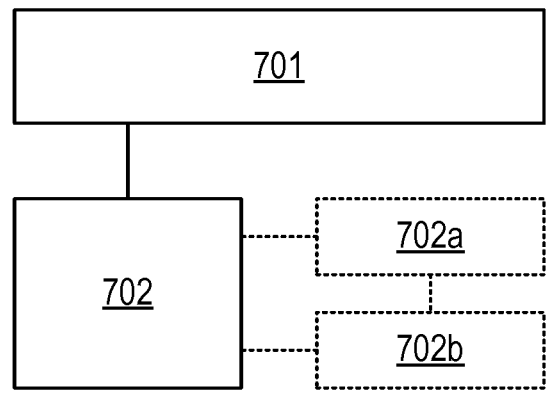
FIG. 7 shows an exemplary method to overcome offsets on a substrate.

An exemplary method for determining a fingerprint of a performance parameter will now be described with reference to FIG. 7. The exemplary method may, for example, be implemented as part of the method described with reference to FIGS. 4 and 5 above, although it will be appreciated that it may be implemented in isolation or as part of an alternative method. For purposes of clarity and conciseness only, the method as described in the following is implemented on a structure comprising a single $n^{th}$ layer, such as for example illustrated in FIG. 6. As such, the $n^{th}$ layer will in the following be referred to as the third layer In a first determining step 701, a first fingerprint of a performance parameter associated with a second layer and a third layer of a substrate is determined, wherein the third layer is provided prior to the second layer and the second layer is provided prior to the first layer. As described above, a fingerprint may be determined for any suitable performance parameter, such as (but not limited to): focus; overlay error; or alignment.

In a second determining step 702, a second fingerprint of a performance parameter associated with the first layer and the second layer is determined based on the fingerprint of the performance parameter associated with the second layer and the third layer and at least a further set of characteristics.

Any suitable further set of characteristics may be used. The further set of characteristics may be determined or derived in any suitable fashion. While described as a single step, the second determining step may comprise one or more sub-steps 702a, 702b. It will be appreciated that, while only two sub-steps are illustrated in FIG. 7, the second determining step may, in principle, comprise any suitable number of sub-steps. In some examples, the one or more sub-steps may comprise providing or deriving the further set of characteristics. In an example, the further set of characteristics is determined in a first sub-step 702a. In a second sub-step 702b, the second fingerprint of the performance parameter is determined. It will, of course, be appreciated that the one or more providing or determining sub-steps may be implemented in a plurality of specific ways.

A number of non-limiting examples of providing or deriving sub-steps will now be described in more detail.

In a first example, the further set of characteristics comprises at least one characteristic of the substrate. In an example, the further set of characteristics comprises a characteristic of the substrate associated with at least one process condition associated with provision of at least one of the first, second or third layer on the substrate.

In a second example, the further set of characteristics comprises a third fingerprint of a performance parameter associated with the first layer and the third layer on the substrate, wherein the third fingerprint comprises a first correction. The first correction may be any suitable correction. In an example, the first correction comprises a correction for an expected variation in measurement or process conditions between provision of the first and second and/or the second and third layer on the substrate.

Turning once again to FIG. 6, an exemplary methodology for determining a third fingerprint of a performance parameter, in which an exemplary first correction is employed (as described above), will now be described in further detail. In the present example, as shown in FIG. 6 and described above, a patterned structure comprises a first layer 604 to be patterned, second layer 606 and a single $n^{th}$ (i.e. "third") layer 608. As described above, overlay error between the first layer and the preceding layer (i.e. the second layer) may in the known methods be estimated by utilizing overlay error measurements performed on one or more of the preceding layers. As discussed, however, this does not take into account any differences between estimated and measured overlay errors.

Accordingly, an exemplary expression is proposed, in which the difference between estimates and measurements is taken into account. Similarly to the expression shown above, for exemplary purposes only, it will be assumed that the structure comprises a single $n^{th}$ (third) layer only. The expression may be given as follows:

$$OV_{L1-L2}=(a+b)OV_{L1-L3}-b(OV_{L2-L3}+\Delta)$$

In this expression, similarly to the decomposition rule discussed above, $OV_{L1-L2}$ denotes the overlay error between the first layer and the second layer, $OV_{L1-L3}$ denotes the overlay error between the first layer and the third layer, and $OV_{L2-L3}$ denotes overlay error between the second layer and the third layer. a and b are weighting parameters that allow each of the overlay errors to be weighted so as to improve the accuracy of the estimated overlay error. A is the first correction. Similarly to the decomposition rule discussed above, the values for overlay errors used in the expression may have been estimated overlay errors, measured overlay errors or a mixture of both.

In order derive optimal control of the overlay errors, and by extension the lithographic process, it is necessary to determine values for each of the parameters shown above. In the present example, the correlation between individual overlay errors and the first correction may be controlled by way of the following expression:

$$aOV_{L1-L3}+bOV_{L1-L2}=(a+b)OV_{L1-L3}-b(OV_{L2-L3}+\Delta)$$

The various parameters are identical to those in the expression above. It will be appreciated that the above expression is exemplary only, and that the expression may be implemented in alternative specific ways.

The weighting parameters a,b may be determined or derived in any suitable fashion and according to any set of requirements. In some examples, the weighting parameters may be determined or derived based on the importance or criticality of specific layers. As an example, if, in the expression above, the first layer and the second layer is not critical, the weighting parameter b can be chosen so as to be small. As will be appreciated, in some examples the weighting parameters are inter-related. Accordingly, by modifying or varying one of the weighting parameters, one performance parameter (i.e. overlay error) may be reduced while another one is increased. In some examples, initial values for the weighting parameters are chosen based on a suitable set of requirements (e.g. historical data, statistical data or user selected).

The first correction A may be determined in any suitable fashion and may have any suitable value or range of values. In order to maintain the correlation between measured and estimated overlay error, it may necessary to periodically determine the first correction to be used. The periodicity of such a determination may be fixed, or it may vary in dependence on one or more parameters.

Figure 8:
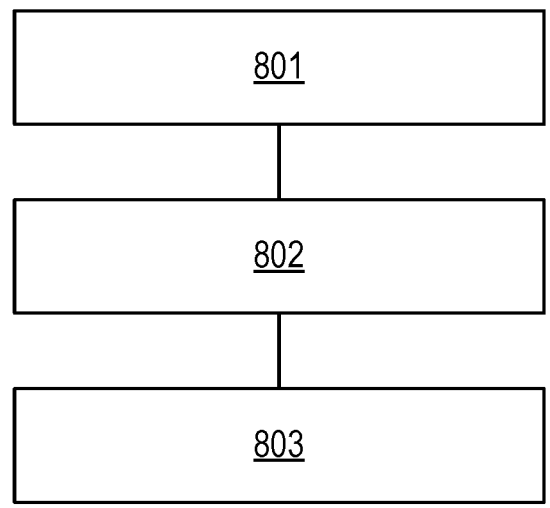
FIG. 8 is an exemplary method for determining a first correction.

An exemplary and non-limiting method for determining the first correction A will now be described with reference to FIG. 8.

In a first step 801, a mismatch between a predicted performance parameter and a measured performance parameter is identified and determined. The mismatch can be identified in any suitable fashion. In some examples, the mismatch is monitored periodically (e.g. using an inspection apparatus). The mismatch may, for example, be monitored on a per-batch basis (i.e. after a specified number of substrate batches have been processed) or on a time basis (i.e. after a certain period of time has elapsed). The periodicity of such monitoring may be determined in any suitable way and may be based on a suitable number of factors. For example, the periodicity may be based on one or more of the following: stability of a first correction fingerprint, statistical or historical data, or other monitoring data. The mismatch may be identified and determined for any suitable layer or layers of a relevant structure. In an example, for a structure comprised of three layers (such as the one illustrated in FIG. 6), the predicted overlay error between the second and third layer is compared with the measured overlay error between the second and third layer to determine the mismatch.

In a second step 802, the first correction is determined. The first correction may be determined in any suitable way. In some examples, the first correction may be a simple difference between an estimated overlay error and a corresponding measured overlay error. In other examples, the first correction is determined by using a suitable expression dependent on one or more suitable parameters (such as, but not limited to, one or more determined or estimated overlay errors between one or more layers). It will be appreciated that the determined value (or values) for the first correction may be dependent on one or more additional parameters (such as, but not limited to, processing parameters or one or more characteristics of the substrates). In some examples, the first correction may be a single value. In other examples, the first correction may be described by way of a certain function with a number of variables.

In a third step 803, the determined first correction is applied in a suitable fashion, for example in a weighted expression such as discussed above.

Figure 9:
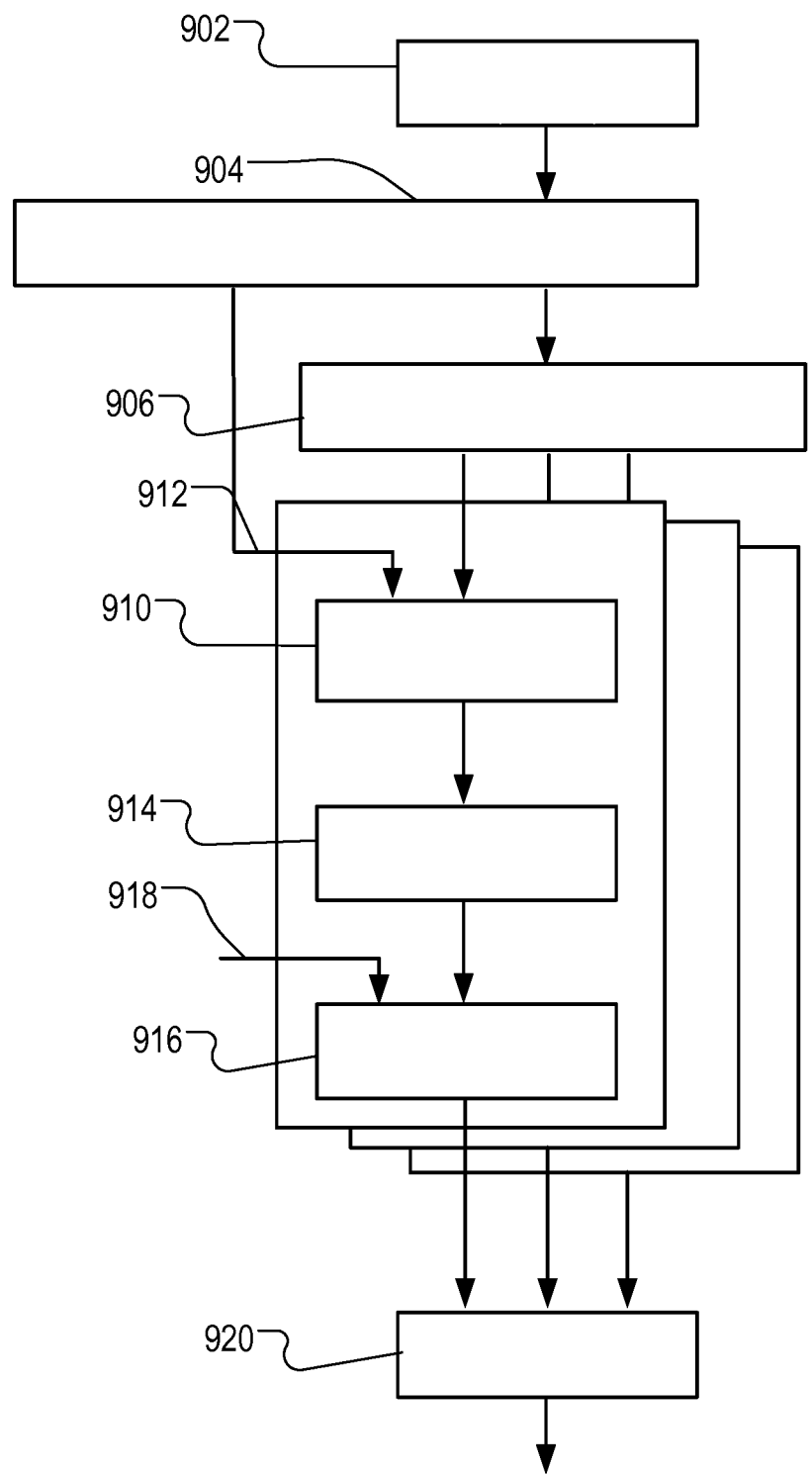
FIG. 9 shows an exemplary control sequence for a lithographic apparatus or system.

FIG. 9 illustrates an exemplary control sequence for a lithographic apparatus or system, such as the one shown in FIG. 1, in which one or more of the above methods are implemented.

At step 902, a set of product units, such as semiconductor substrates, are received for processing by an industrial process (e.g. a lithographic process).

At 904, object data, the object data being associated with at least one set of characteristics of the substrate, or one or more patterned layers of the substrate, is measured on or in relation to the set of product units (and/or received from a pre-existing measurement). Any suitable type of object data may be employed. In the manufacturing facility of FIG. 1, for example, object data may be (without limitation): alignment data measured within lithographic apparatus 100 as a preliminary step in patterning the substrates; substrate shape data measured in a substrate shape metrology tool prior to patterning the substrates; or it may be performance data measured using metrology apparatus 140 after a previous step where a layer has been processed. The object data may in some examples comprise more than one kind of data.

At step 906, in this example, the set of product units being subjected to the industrial process is partitioned into a plurality of subsets. It will be appreciated that this step is substantially identical to the first step 301 of the method discussed with reference to FIG. 3. Accordingly, in some examples, the partitioning step is based on at least one set of characteristics associated with a first layer of the substrates as described above. The partitioning may be performed in any suitable fashion. In some examples, the partitioning is based on statistical analysis of one or more kinds of object data measured in step 304. Additionally, in some examples, the partitioning may be performed based on context data received with the product units.

Subsequently, for each subset, at 910 one or more sample product units is selected for metrology. This step is performed using object data 912 representing one or more parameters measured in relation to the plurality of product units in step 904. The selection of sample product units is, in some examples, based at least partly on statistical analysis of the object data 912. The object data 912 used for this step may be the same kind or a different kind than the object data (if any) used in the partitioning step 906.

At 914, one or more metrology steps are performed only on the selected sample product units out of the plurality of product units. It will be appreciated that this step is substantially identical to the second step 302 of the method described with reference to FIG. 3.

At 916, based at least partly on the metrology of the selected sample product units, corrections are derived for use in controlling processing of the plurality of product units. This step is substantially identical to the third step 303 of the method described with reference to FIG. 3. The corrections may be derived using context data 918, in addition. The corrections are used at 920 to control the processing of the product units, for example to apply patterns to wafers in a semiconductor manufacturing facility.

The manner of measuring the sample product units and the manner of calculating corrections using the measurements may be any of the techniques known in the relevant manufacturing art. In accordance with the principles of the present disclosure, because the selection of sample product units is based at least partly on statistical analysis of the object data, the accuracy of control achievable can be improved, for a given level of metrology overhead.

In traditional approaches for lot-level and chuck-level control in semiconductor manufacturing, a limited set of metrology substrates (typically 2 per chuck) is selected. It is known to select substrates from the center of the lot to avoid heating effects entering the control loop. However, due to the complex processing context a lot experiences in its lifetime, the substrates inside the lot could have different overlay fingerprints, according to in which chambers or tools they e.g. have been processed, their orientation in those chambers, etc. Typically this results in a distribution of fingerprints, often leading to "subpopulations" or groupings within the lot of substrates with similar shapes and fingerprints due to similar processing history. This distribution of fingerprints is obviously not taken into account when "randomly" picking sample substrates from a lot, and consequently these sample substrates might not be representative for the lot and the distribution of fingerprints within that lot, which may result in an overlay penalty when process corrections are based on the selected substrates and applied to the whole lot. Furthermore, there is a risk in situations where processing errors or other situations affect certain substrates, and these "excursion" substrates are selected by chance as metrology substrates. Measurements from the excursion substrates subsequently "contaminate" the overlay control loop with their excursion fingerprints. Because of the need to limit metrology overhead in high volume manufacturing situations, the number of sample substrates will be relatively small, and such contamination can have a disproportionate effect.

Where the set of substrates can be partitioned into subsets, as illustrated above, a first improvement in the selection of sample substrates can be made by selecting sample substrates specifically within each subset. This may, for example, be implemented by utilizing a multi-threaded control method in which measured performance data are applied in controlling the appropriate thread. However, multi-threaded methods makes the problem of metrology overhead more acute, and random selection of sample wafers within the subsets may still lead to metrology being performed on a wafer that is not truly representative of the majority. Selection of sample product units may also be, for example, be performed with the aid of statistical analysis of object data, so that the selected of unrepresentative product units is avoided or reduced.

Figure 10:
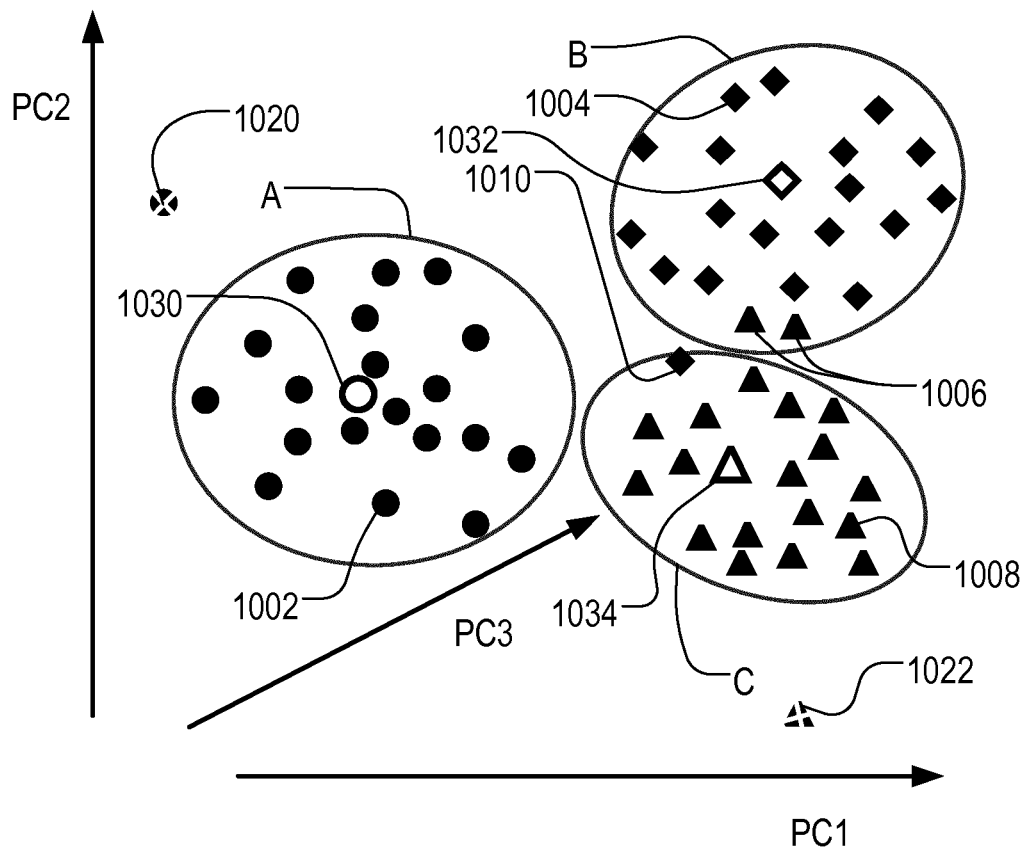
FIG. 10 illustrates figuratively a first exemplary partitioning of product units into different subsets based on statistical analysis.

FIG. 10 illustrates figuratively the partitioning of product units into different subsets or "clusters", based on the results of the statistical analysis. Performance data for a number of product units is represented by points on a three-dimensional graph, whose axes are principal components PC1, PC2 and PC3 found by the statistical analysis. The product units in this example have been assigned to three clusters, labeled A, B and C. Thus, product unit represented by point 1002 is initially assigned to cluster A, product units represented by points 1004 and 1006 are initially assigned to cluster B, and points 1008 and 1010 are initially assigned to cluster C. It should be borne in mind that this two-dimensional representation of a three-dimensional graph is only a simplified illustration, and partitioning may be performed based on three, four, 10 or more components.

Also shown in FIG. 10 are two "outlier" or "excursion" wafers 1020, 1022 that are not readily assigned to any of the clusters. These can be identified by statistical analysis, as will be described further below. Within each cluster, another sample is highlighted (1030, 1032, 1034), which will be explained further below.

Using the principle components as a reference, excursion wafers 1020 and 1022 can be recognized. In some embodiments of the method of FIG. 9, the statistical analysis of object data 912 allows these excursion wafers to be identified and excluded from consideration as potential sample wafers for metrology in step 910. In such embodiments, therefore, selecting the sample product unit or product units includes elimination of product units that are identified by said statistical analysis as unrepresentative of the plurality of product units. Even if sample wafers would then be selected at random from the remaining members of each subset, at least the problem of "contamination" mentioned above, would be reduced.

Boundaries for the exclusion of excursion wafers can be defined in the multi-dimensional space, or in a single dimension, if desired. The boundaries can be defined entirely automatically and/or with expert assistance, and may have arbitrary shape in the multi-dimensional space defined by the statistical analysis. For example, tight boundaries may surround individual clusters, or one boundary may encompass the entire set. The boundaries can be refined as volume manufacturing progresses, and may be set wider in a development phase.

To further improve the quality of monitoring and performance control, in some embodiments of the method, selecting sample product units for metrology includes preferentially selecting product units that are identified by said statistical analysis as most representative of the plurality of product units. In the example of FIG. 10, certain wafers 1030, 1032 and 1034 are highlighted which are deemed to be most representative of their particular cluster. Using one or more of the observed fingerprints, the wafers of the cluster A can be analyzed to identify wafer 1030 as having the combination of fingerprint coefficients most typical of the wafers in the cluster. In the drawing, this is illustrated by wafer 1030 being closest to the center of the distribution of wafers of the cluster, within the multidimensional space. Similarly, each wafer 1032, 1034 is centrally located in the distribution of wafers in the clusters B and C, respectively.

Figure 11:
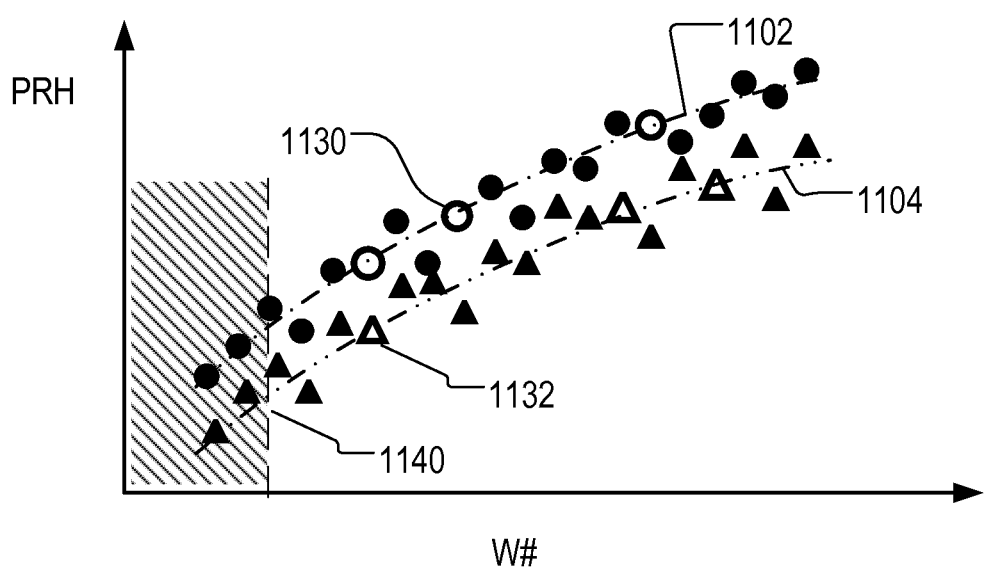
FIG. 11 illustrates figuratively a second exemplary partitioning of product units into different subsets based on statistical analysis.

FIG. 11 illustrates another example of the type of statistical analysis that might be applied, in particular a mixed regression analysis. In the example of FIG. 11, the horizontal axis represents wafer number within a lot, passing through the lithographic apparatus 100. A lot may for example include 25 wafers in a typical semiconductor manufacturing facility. It is known that certain error fingerprints arise from thermal effects that build during exposure of a lot, and dissipate again prior to exposure of the next lot. An example of such an effect may be reticle (mask) heating, and a feedforward control system may define reticle heating corrections to be applied with a logarithmically increasing intensity through the course of the lot. In order to determine the appropriate logarithmic curve and intensity levels, statistical analysis of historic object data will generally be performed, rather than attempting to predict the required correction from any "first principles" calculation. As mentioned above, the object data in such an example may be other than performance data measured on processed product units. It may be object data measured before or during processing on the product units, or on other parts of the system. An example of object data is alignment data measured from each wafer. Another example is mask alignment data measured using marks on the patterning device (mask or reticle) and sensors located beside the wafer on the substrate table or associated measurement table. Mask alignment data may be particularly useful in the example of identifying reticle heating fingerprints, illustrated in FIG. 11.

In this example, where wafers are clustered along two curves 1102, 1104 by a mixed regression analysis, substrates 1130, 1132 that lie on or close to the curve can be selected as representative samples for metrology, in preference to other wafers that belong to the relevant cluster, but are some distance from the curve in the parameter PRH that is plotted. The distance from the curve may be used as a score for ranking the wafers in this selection process. KPIs such as Silhouette value can be extended to clustering in a curve-based space, as well as clustering in the principle components.

As in the case of FIG. 10, additional constraints may be designed into the selection of sample product units. Such a constraint is illustrated at 1140 in FIG. 11, which forbids the selection of a sample wafer from among the first number of wafers in the lot. In other words, it is deemed that the earliest wafers in the lot are not to be considered as representative of the majority of the wafers, even if they would fall exactly on the curve 1102 or 1104.

Further aspects of the invention are disclosed in the numbered embodiments below.

1. A method for optimizing a lithographic process, the method comprising:

partitioning a set of substrates associated with at least a first layer into a plurality of subsets of substrates;

determining a fingerprint of a performance parameter associated with the at least first layer for at least one substrate of the set of substrates; and deriving a correction for the performance parameter associated with an application of a subsequent layer to the set of substrates based on the determined fingerprint and the partitioning of the set of substrates.

2. A method according to embodiment 1, wherein the step of partitioning is based on at least one set of characteristics associated with the at least first layer.

3. A method according to embodiment 2, wherein each of the plurality of subsets is associated with at least one value of at least one of the set of characteristics associated with the at least first layer.

4. A method according to embodiment 2 or 3, wherein the at least one set of characteristics comprises at least one performance parameter associated with the at least first layer.

5. A method according to any preceding embodiment, wherein the step of determining comprises:

determining a first fingerprint of a performance parameter associated with a second layer and an $n^{th}$ layer of the substrate, wherein the $n^{th}$ layer is provided prior to the second layer and the second layer is provided prior to the first layer; and determining a second fingerprint of a performance parameter associated with the first layer and the second layer based on the fingerprint of the performance parameter associated with the second layer and the $n^{th}$ layer and at least a further set of characteristics.

6. A method according to embodiment 5, wherein the further set of characteristics comprises a characteristic of the substrate associated with at least one process condition associated with provision of at least one of the first, second or $n^{th}$ layer on the substrate.

7. A method according to embodiment 5, wherein the further set of characteristics comprises an $n^{th}$ fingerprint of a performance parameter associated with the first layer and the $n^{th}$ layer on the substrate, wherein the third fingerprint comprises a first correction.

8. A method according to embodiment 7, wherein the first correction comprises a correction for an expected variation in measurement or lithographic process conditions between provision of the first and second and second and $n^{th}$ layer on the substrate.

9. A method according to any preceding embodiment, wherein the step of determining comprises determining the fingerprint for at least one substrate of each of the plurality of subsets of substrates.

10. A method according to embodiment 9, wherein the step of determining further comprises determining the fingerprint for a plurality of substrates of each of the plurality of subsets of substrates.

11. A method according to any preceding embodiment, wherein the step of determining comprises determining a plurality of fingerprints for each of a plurality of performance parameters associated with the at least first layer.

12. A method according to any preceding embodiment, wherein the step of deriving a correction is based on each of the determined fingerprints for each substrate associated with at least one of the plurality of subsets of substrates.

13. A method according to any preceding embodiment, wherein the step of deriving a correction for the performance parameter is further based on at least one determined fingerprint for each of a plurality of preceding layers.

14. A method according to any preceding embodiment, wherein the performance parameter comprises at least one of: focus error; alignment error; or overlay error.

15. A method for optimizing a lithographic process, wherein the step of determining comprises:

determining a first fingerprint of a performance parameter associated with a second layer and an $n^{th}$ layer of the substrate, wherein the $n^{th}$ layer is provided prior to the second layer and the second layer is provided prior to the first layer; and determining a second fingerprint of a performance parameter associated with the first layer and the second layer based on the fingerprint of the performance parameter associated with the second layer and the $n^{th}$ layer and at least a further set of characteristics.

16. A method according to embodiment 15, wherein the further set of characteristics comprises a characteristic of the substrate associated with at least one process condition associated with provision of at least one of the first, second or $n^{th}$ layer on the substrate.

17. A method according to embodiment 15, wherein the further set of characteristics comprises an $n^{th}$ fingerprint of a performance parameter associated with the first layer and the $n^{th}$ layer on the substrate, wherein the $n^{th}$ fingerprint comprises a first correction.

18. A method according to embodiment 17, wherein the first correction comprises a correction for an expected variation in measurement or lithographic process conditions between provision of the first and second and second and $n^{th}$ layer on the substrate.

19. A control system for controlling a lithographic process, the control system comprising: an arrangement for performing the partitioning step of a set of substrates into a plurality of subsets of substrates according to any of embodiments 1 to 14;

an arrangement for carrying out a determining step of a fingerprint of a performance parameter according to any of embodiments 1 to 14; and an arrangement for carrying out a deriving step of a correction for the performance parameter according to any of embodiments 1 to 14.

20. A control system for controlling a lithographic process, the control system comprising:

an arrangement for performing a determining step of a first fingerprint of a performance parameter according to any of embodiments 15 to 18; and an arrangement for performing a determining step of a second fingerprint of a performance parameter according to any of embodiments 15 to 18.

21. A lithographic apparatus comprising:

an illumination optical system arranged to illuminate a pattern, and a projection optical system arranged to project an image of the pattern onto a substrate; and a control system according to embodiment 19 or embodiment 20.

22. An inspection apparatus comprising a control system according to embodiment 19 or embodiment 20.

22. A lithographic system comprising a lithographic apparatus according to embodiment 21 or an inspection apparatus according to embodiment 22.

23. A computer program product containing one or more sequences of machine-readable instructions for implementing a method according to any of embodiments 1 to 15.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method for optimizing a lithographic process, the method comprising:
   partitioning a set of substrates having at least a first patterned layer into a plurality of subsets of substrates, wherein the partitioning is based on at least one set of characteristics associated with the at least first patterned layer;
   determining a fingerprint of a performance parameter associated with the at least first patterned layer for at least one substrate of the plurality of subsets of substrates; and
   deriving, by a hardware computer system, a correction for patterning a subsequent layer on to the set of substrates based on the determined fingerprint and the partitioning of the set of substrates.

2. The method according to claim 1, wherein each of the plurality of subsets is associated with at least one value of at least one set of characteristics of the at least one set of characteristics associated with the at least first patterned layer.

3. The method according to claim 1, wherein the at least one set of characteristics comprises at least one performance parameter associated with the at least first patterned layer.

4. The method according to claim 1, wherein the determining comprises:
   determining a first fingerprint of a performance parameter associated with a second layer and an $n^{th}$ layer of the substrate, wherein the $n^{th}$ layer is provided to the substrate prior to the second layer being provided to the substrate and the second layer is provided to the substrate prior to the first patterned layer; and
   determining a second fingerprint of a performance parameter associated with the first patterned layer and the second layer based on the fingerprint of the performance parameter associated with the second layer and the $n^{th}$ layer and at least a further set of characteristics.

5. The method according to claim 4, wherein the further set of characteristics comprises a characteristic of the substrate associated with at least one process condition associated with provision of at least one selected from: the first patterned layer on the substrate, the second layer on the substrate, or the $n^{th}$ layer on the substrate.

6. The method according to claim 4, wherein the further set of characteristics comprises an $n^{th}$ fingerprint of a performance parameter associated with the first patterned layer and the $n^{th}$ layer on the substrate, wherein the third fingerprint comprises a first correction.

7. The method according to claim 6, wherein the first correction comprises a correction for an expected variation in measurement or lithographic process conditions between provision of the first and second and second and $n^{th}$ layer on the substrate.

8. The method according to claim 1, wherein the deriving a correction is further based on at least one determined fingerprint for each of a plurality of preceding layers.

9. The method according to claim 1, wherein the performance parameter comprises at least one selected from: focus error; alignment error; or overlay error.

10. The method according to claim 1, wherein the determining comprises determining the fingerprint for at least one substrate of each subset of the plurality of subsets of substrates.

11. The method according to claim 10, wherein the determining further comprises determining the fingerprint for a plurality of substrates of each subset of the plurality of subsets of substrates.

12. The method according to claim 1, wherein the determining comprises determining a plurality of fingerprints for each performance parameter of a plurality of performance parameters associated with the at least first layer.

13. The method according to claim 1, wherein the deriving a correction is based on each of the determined fingerprints for each substrate associated with at least one subset of the plurality of subsets of substrates.

14. A non-transitory computer program product containing one or more sequences of machine-readable instructions therein, the instructions, upon execution by a computer system, configured to cause the computer system to at least:
   partition a set of substrates having at least a first patterned layer into a plurality of subsets of substrates, wherein the partitioning is based on at least one set of characteristics associated with the at least first patterned layer;
   determine a fingerprint of a performance parameter associated with the at least first patterned layer for at least one substrate of the plurality of subsets of substrates; and
   derive a correction for patterning a subsequent layer using a lithographic process on the set of substrates based on the determined fingerprint and the partitioning of the set of substrates.

15. A control system for controlling a lithographic process, the control system comprising:
   the non-transitory computer product according to claim 14; and
   a computer system configured to execute the instructions.

16. The computer program product of claim 14, wherein the instructions configured to cause the computer system to derive the correction are further configured to derive the correction based on at least one determined fingerprint for each of a plurality of preceding layers.

17. A method comprising:
   determining a first fingerprint of a performance parameter associated with a second layer and an $n^{th}$ layer of a substrate, wherein the $n^{th}$ layer is provided to the substrate using a lithographic process prior to the second layer being provided to the substrate and the second layer is provided to the substrate prior to a first layer of the substrate; and determining, by a hardware computer system, a second fingerprint of a performance parameter associated with the first layer and the second layer based on the fingerprint of the performance parameter associated with the second layer and the $n^{th}$ layer and at least a further set of characteristics.

18. The method according to claim 17, wherein the further set of characteristics comprises a characteristic of the substrate associated with at least one process condition associated with provision of at least one selected from: the first layer on the substrate, the second layer on the substrate, or the $n^{th}$ layer on the substrate.

19. The method according to claim 17, wherein the further set of characteristics comprises an $n^{th}$ fingerprint of a performance parameter associated with the first layer and the $n^{th}$ layer on the substrate, wherein the $n^{th}$ fingerprint comprises a first correction.

20. The method according to claim 19, wherein the first correction comprises a correction for an expected variation in measurement or lithographic process conditions between provision of the first and second and second and $n^{th}$ layer on the substrate.

21. A non-transitory computer program product containing one or more sequences of machine-readable instructions therein, the instructions, upon execution by a computer system, configured to cause the computer system to at least:

determine a first fingerprint of a performance parameter associated with a second layer and an $n^{th}$ layer of a substrate, wherein the $n^{th}$ layer is provided to the substrate using a lithographic process prior to the second layer being provided to the substrate and the second layer is provided to the substrate prior to a first layer of the substrate; and determine a second fingerprint of a performance parameter associated with the first layer and the second layer based on the fingerprint of the performance parameter associated with the second layer and the $n^{th}$ layer and at least a further set of characteristics.

\* \* \* \* \*